(12) United States Patent
Beer et al.

(10) Patent No.: US 7,807,506 B2
(45) Date of Patent: Oct. 5, 2010

(54) MICROELECTROMECHANICAL SEMICONDUCTOR COMPONENT WITH CAVITY STRUCTURE AND METHOD FOR PRODUCING THE SAME

(75) Inventors: Gottfried Beer, Nittendorf (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 311 days.

(21) Appl. No.: 11/701,044

(22) Filed: Feb. 1, 2007

(65) Prior Publication Data

US 2007/0181979 A1    Aug. 9, 2007

(30) Foreign Application Priority Data

Feb. 3, 2006   (DE) .................... 10 2006 005 419

(51) Int. Cl.
    *H01L 21/00* (2006.01)
(52) U.S. Cl. .................... 438/113; 438/456; 257/678; 257/E21.499
(58) Field of Classification Search ................ 438/113, 438/116, 125, 455, 458, 459, 460, 456; 257/678, 257/E21.499
    See application file for complete search history.

(56) References Cited

U.S. PATENT DOCUMENTS

| | | | |
|---|---|---|---|
| 5,323,051 A | | 6/1994 | Adams et al. |
| 5,923,958 A * | | 7/1999 | Chou .................... 438/118 |
| 6,809,412 B1 * | | 10/2004 | Tourino et al. ............ 257/678 |
| 6,897,428 B2 * | | 5/2005 | Minamio et al. ......... 250/208.1 |
| 6,956,283 B1 | | 10/2005 | Peterson |
| 6,982,470 B2 * | | 1/2006 | Omori .................... 257/434 |
| 7,049,175 B2 * | | 5/2006 | Schaper et al. ........... 438/113 |
| 7,060,098 B2 | | 6/2006 | Errico et al. |
| 7,273,765 B2 * | | 9/2007 | Minamio et al. ........... 438/68 |
| 2001/0017675 A1 * | | 8/2001 | Inoue et al. ............... 349/86 |
| 2004/0201090 A1 | | 10/2004 | Aigner et al. |
| 2005/0079686 A1 | | 4/2005 | Aigner et al. |

(Continued)

FOREIGN PATENT DOCUMENTS

DE   10206919   8/2003

(Continued)

OTHER PUBLICATIONS

McMahon et al., Wafer Bonding of Damascene-Patterned Metal/Adhesive Redistribution Layers for Via-First Three-Dimensional (3D) Interconnect, Electronic Components and Technology Conference, 2005, pp. 331-336.

(Continued)

*Primary Examiner*—Khiem D Nguyen
(74) *Attorney, Agent, or Firm*—Dicke, Billig & Czaja, PLLC

(57) ABSTRACT

One aspect of the invention relates to a semiconductor component with cavity structure and a method for producing the same. The semiconductor component has an active semiconductor chip with the microelectromechanical structure and a wiring structure on its top side. The microelectromechanical structure is surrounded by walls of at least one cavity. A covering, which covers the cavity, is arranged on the walls. The walls have a photolithographically patterned polymer. The covering has a layer with a polymer of identical type. In one case, the molecular chains of the polymer of the walls are crosslinked with the molecular chains of the polymer layer of the covering layer to form a dimensionally stable cavity housing.

18 Claims, 9 Drawing Sheets

U.S. PATENT DOCUMENTS

2005/0146022 A1    7/2005    Franosch et al.

FOREIGN PATENT DOCUMENTS

| | | |
|---|---|---|
| DE | 10256116 | 7/2004 |
| DE | 10310617 | 9/2004 |
| DE | 10353767 | 6/2005 |
| DE | 69928978 | 1/2006 |
| EP | 0794616 | 1/2003 |
| EP | 0940257 | 12/2005 |

OTHER PUBLICATIONS

Hudson Publications, Thermoset vs. Thermoplastic Materials, Hudson Publications, www.rlhuson.com/publications/techfiles/thermo.htm, 2 pages.

\* cited by examiner

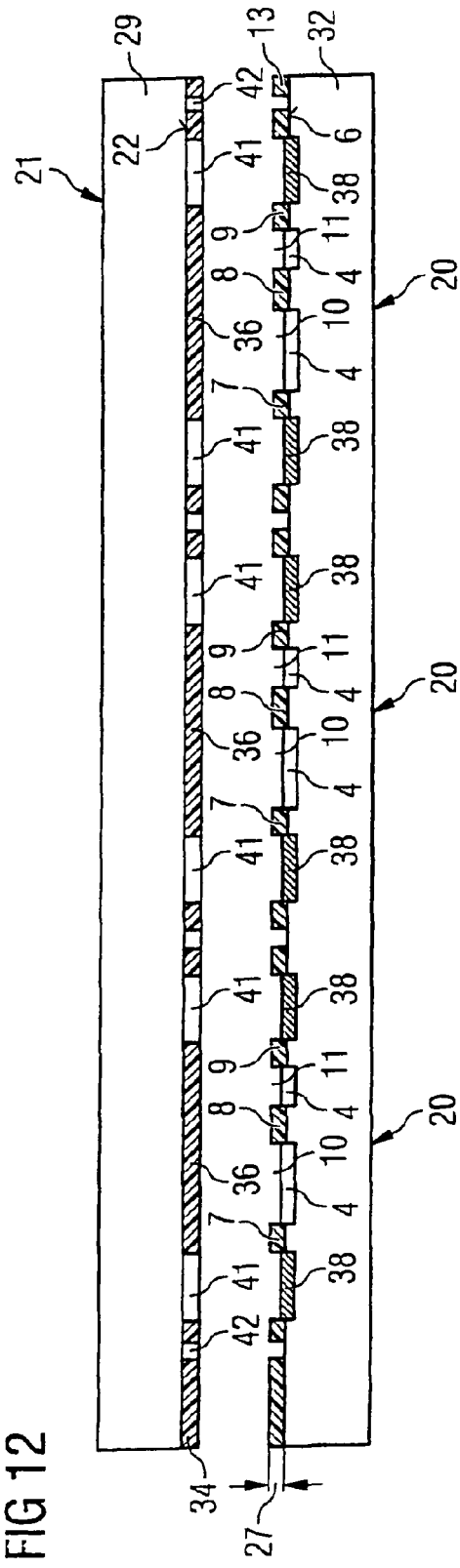
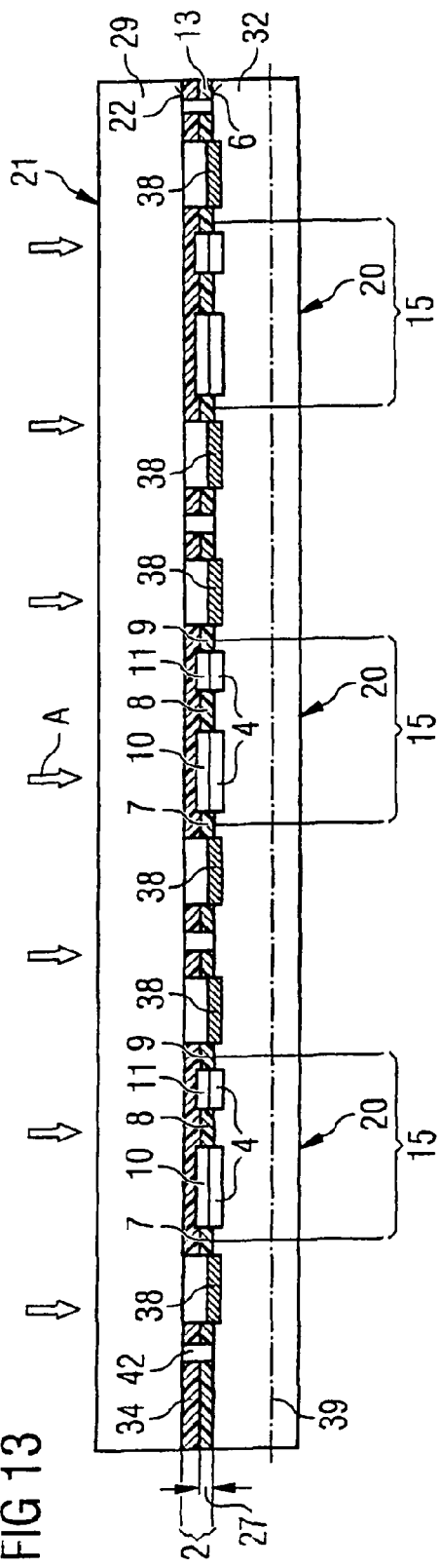
FIG 12
FIG 13

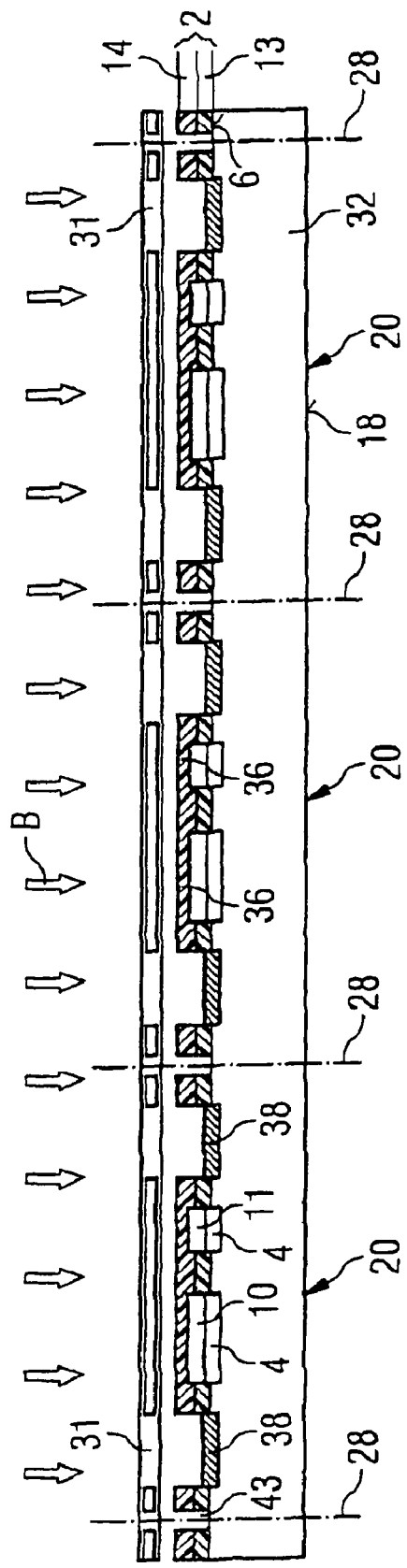

MICROELECTROMECHANICAL SEMICONDUCTOR COMPONENT WITH CAVITY STRUCTURE AND METHOD FOR PRODUCING THE SAME

CROSS-REFERENCE TO RELATED APPLICATIONS

This Utility Patent Application claims priority to German Patent Application No. DE 10 2006 005 419.9 filed on Feb. 3, 2006, which is incorporated herein by reference.

BACKGROUND

The invention relates to a microelectromechanical semiconductor component with cavity structure, wherein the semiconductor component has an active semiconductor chip with a microelectromechanical structure and a wiring structure on its top side, and wherein the microelectromechanical structure is surrounded by walls of at least one cavity, and a covering of the cavity is arranged on the walls.

A semiconductor component of this type is known from the document DE 103 10 617 A1. With this known semiconductor component, the components of the semiconductor component including an active semiconductor chip, a cover semiconductor chip and a wall structure between the active semiconductor chip and the cover semiconductor chip are embedded into a plastic housing composition, and thus take up a large space requirement.

What is more, the known semiconductor component the wiring structure on the top side of the active semiconductor chip that is connected via bonding connections to surface-mountable external contacts, bonding arcs of the bonding connections between the active semiconductor chip and the external contacts requiring a minimum height for the wall structure of the cavity which may not be undershot without jeopardizing the functionality of the semiconductor component. Consequently, the known semiconductor component cannot be minimized further in terms of its spatial extent.

The document DE 102 56 116 discloses an electronic device and a method for producing it in which the microelectromechanical structure is protected by a self-supporting, electrically conductive covering layer, the self-supporting covering layer being supported by passage lines, with the result that a cavity is formed over the active area region of the micromechanical structure.

With this electronic device, a prerequisite for cavity formation is the provision of a metal coating, in which case, furthermore, for the patterning of the cavity, the latter is firstly filled with a sacrificial structure made from suitable material, which subsequently has to be removed via openings.

The document DE 103 53 767 furthermore discloses a device for housing a micromechanical structure and a method for producing the same in which a photoresist that forms the cavity is provided as sacrificial material in uncrosslinked fashion in the region of the cavity. For this purpose, the uncrosslinked photoresist is surrounded by a crosslinked photoresist region with an opening via which the uncrosslinked sacrificial material can be removed by solvents.

With this device, openings for removing the sacrificial material are likewise necessary in order to ensure the cavity for the housing process. What is more, a costly method is required in order to realize such a device with cavity.

SUMMARY

In accordance with one embodiment of the invention a semiconductor component with a cavity structure is disclosed. The semiconductor component has an active semiconductor chip with the microelectromechanical structure and a wiring structure on its top side. The microelectromechanical structure is surrounded by walls of at least one cavity. A covering, which covers the cavity, is arranged on the walls. The walls have a photolithographically patterned polymer. The covering has a layer with a polymer of identical type. In one case, the molecular chains of the polymer of the walls are crosslinked with the molecular chains of the polymer layer of the covering layer to form a dimensionally stable cavity housing.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The invention will now be explained in more detail with reference to the accompanying figures.

FIG. 2 illustrates a schematic cross section through an active semiconductor wafer with semiconductor chip positions.

FIG. 3 illustrates a schematic cross section through the semiconductor wafer, in accordance with FIG. 2, with microelectromechanical structures introduced in the semiconductor chip positions.

FIG. 4 illustrates a schematic cross section through the semiconductor wafer, in accordance with FIG. 3, after the application of a wiring structure.

FIG. 5 illustrates a schematic cross section through the semiconductor wafer, in accordance with FIG. 4, after the application of a wall structure.

FIG. 6 illustrates a schematic cross section through a passive covering wafer.

FIG. 7 illustrates a schematic cross section through the semiconductor wafer, in accordance with FIG. 5, and the covering wafer arranged above it, in accordance with FIG. 6.

FIG. 8 illustrates a schematic cross section through the semiconductor wafer, in accordance with FIG. 7, after the placement of the covering wafer.

FIG. 9 illustrates a schematic cross section through the wafer stack after the curing of the polymer arranged between the wafers.

FIG. 10 illustrates a schematic cross section through two microelectromechanical semiconductor components after the separation of the wafer stack, in accordance with FIG. 9.

FIGS. 12 to 16 illustrate schematic cross sections through components during the production of the semiconductor component of the second embodiment of the invention.

FIG. 12 illustrates a schematic cross section through an active semiconductor wafer with semiconductor chip positions and an auxiliary carrier with a patterned polymer layer.

FIG. 13 illustrates a schematic cross section through the semiconductor wafer, in accordance with FIG. 12, after the placement of the auxiliary carrier.

FIG. 14 illustrates a schematic cross section through the semiconductor wafer, in accordance with FIG. 13, after the removal of the auxiliary carrier.

FIG. 15 illustrates a schematic cross section through the semiconductor wafer, in accordance with FIG. 14, after the application of external contact areas for surface mounting.

FIG. 16 illustrates schematic cross sections through semiconductor components of the second embodiment of the invention.

FIGS. 19 to 21 illustrate schematic cross sections through components during the production of the semiconductor component, in accordance with FIG. 11, by means of a further method variant.

FIG. 19 illustrates a schematic cross section through an active semiconductor wafer with semiconductor chip positions and an auxiliary carrier with a non-patterned polymer layer.

FIG. 20 illustrates a schematic cross section through the semiconductor wafer, in accordance with FIG. 19, after the placement of the auxiliary carrier.

FIG. 21 illustrates a schematic cross section through the semiconductor wafer, in accordance with FIG. 20, after the removal of the auxiliary carrier and after the arrangement of an exposure mask.

DETAILED DESCRIPTION

Figure 1:
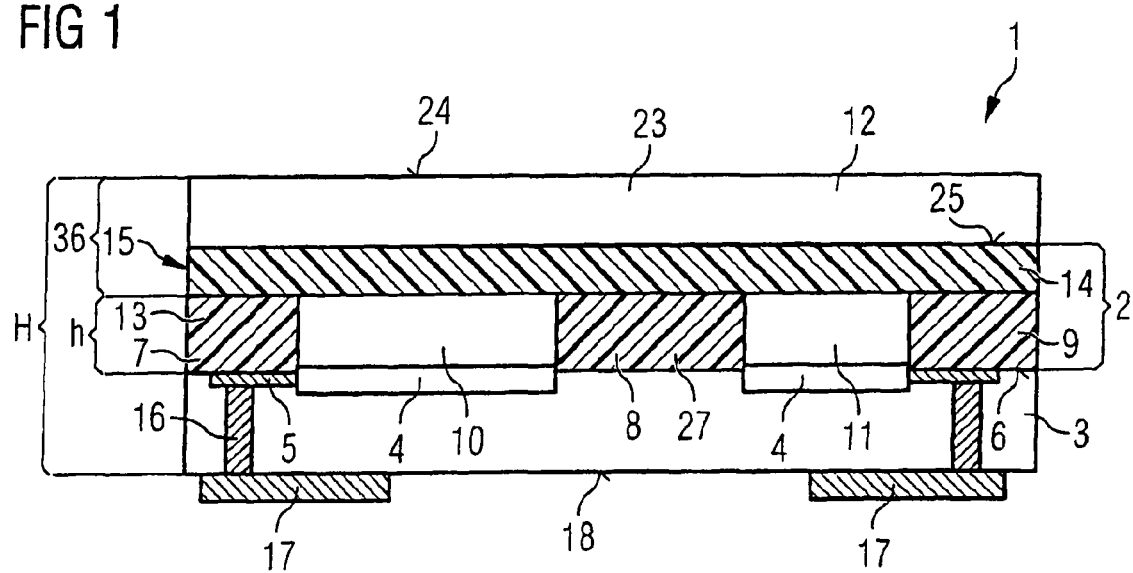
FIG. 1 illustrates a schematic cross section through a microelectromechanical semiconductor component with cavity structure in accordance with a first embodiment of the invention.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention provides a semiconductor component with microelectromechanical structure which has at least one cavity over the microelectromechanical structure and is simplified further in terms of its housing construction and can be produced cost-effectively.

One aspect of the invention provides a microelectromechanical semiconductor component with cavity structure, wherein the semiconductor device has an active semiconductor chip with a microelectromechanical structure and with a wiring structure on its top side. The microelectromechanical structure is surrounded by walls of at least one cavity. A covering, which covers the cavity, is arranged on the walls. The walls include a photolithographically patterned polymer and the covering has a layer with a polymer of identical type. In this case, the molecular chains of the polymer of the walls are crosslinked together with the molecular chains of the polymer layer of the covering to form a dimensionally stable cavity housing.

This semiconductor component is mechanically protected by the covering and, by means of the polymers of the wall structure and of the covering that are crosslinked together with one another, is provided with a housing which does not have to be reinforced by an additional plastic housing composition, as in the prior art. It is thus possible to provide a microelectromechanical semiconductor component greatly reduced in size in terms of its space requirement. The covering furthermore ensures that the function of the microelectromechanical structure is protected against external damage and influences in the region of the dimensionally stable cavity housing, with the result that the microelectromechanical function is not impaired.

If an interaction with the environment is required, as may be the case for micromembranes and/or vibrating reeds and also for microactuators, the covering may be provided with a corresponding opening in order to ensure said interaction with the environment. In the case of a BAW filter (bulk acoustic wave filters), a hermetically closed cavity is advantageous, so that no openings whatsoever are to be provided in the covering and/or in the semiconductor chip. Rather, the cavity may be filled with an inert gas in order to improve the mode of operation of the piezoelectric elements of a BAW filter and their corrosion resistance.

In one embodiment of the invention, the polymer of the covering and of the walls includes a completely crosslinked benzocyclobutene (BCB). Benzocyclobutenes of this type have the advantage that they can be patterned photolithographically. Furthermore, they have the advantage that they can be applied to a semiconductor wafer in different thicknesses d in micrometers between $0.3\ \mu m \leq d \leq 80\ \mu m$, so that, depending on the oscillation amplitudes of the microelectromechanical structure, the thickness d of the wall structure can be adapted to the respective requirements.

In one example, a cavity housing of this type is provided for semiconductor components which have a micromembrane or a vibrating reed or a microactuator, so that a sufficiently large cavity is to be provided for the movements in order not to impede the movement sequences.

Outside the cavity construction, the wiring structure may have external contact areas that are free of a coating, so that external contacts can be arranged thereon. Said external contacts project beyond the cavity structure and can thus be surface-mounted on a superordinate circuit board. The external contact areas are electrically connected to the microelectromechanical structure via conductor tracks.

The wiring structure arranged on the top side of the active semiconductor chip is partly covered by a polymer at the edge and partly extends into the uncovered region of the microelectromechanical structure, so that the wiring structure is electrically connected to the microelectromechanical structure on the top side of the active semiconductor chip. Moreover, the rear side of the active semiconductor chip may simultaneously form the underside of the semiconductor component, external contacts being arranged on external contact areas on the underside of the semiconductor component.

In one embodiment of the invention, a self-supporting cover is provided as a covering of the cavity. A passive semiconductor chip, a metal chip or a plastic chip may be used for the self-supporting cover. A metal chip is preferably used when the dimensionally stable cover is simultaneously intended to have a shielding effect against electromagnetic interference fields. A passive semiconductor chip as a dimensionally stable cover has the advantage that, for the production of such a microelectromechanical semiconductor component, two semiconductor wafers for a multiplicity of microelectromechanical semiconductor components can be joined onto one another in a sandwich design.

A plastic chip is used as a dimensionally stable cover when an electromagnetic coupling of the microelectromechanical structure to the environment is desirable, as is advantageous for microelectromechanical relays, actuators and other applications.

In a further embodiment of the invention, the self-supporting cover includes a passive, thinned semiconductor chip. Since the dimensional stability in semiconductor materials, in particular in silicon, is afforded even for thinned semiconductor chips having a thickness of a few tens of micrometers, the device height of the microelectromechanical semiconductor component can be reduced further by means of a thinned semiconductor chip as self-supporting, passive cover.

It is also possible not only to use a thinned cover chip, but also, in a further preferred embodiment of the invention, to use a thinned active semiconductor chip. This is because as soon as the cavity housing made from fully crosslinked polymer has been completed, it is possible to thin both chips, namely both the cover chip and the active semiconductor chip, since the cavities are hermetically closed. The thinning is preferably carried out as early as in the state of the wafers simultaneously for a multiplicity of microelectromechanical semiconductor components.

It is furthermore provided that the self-supporting cover has an areal extent corresponding to the areal extent of the active semiconductor chip. This congruence of the two chips that are stacked one on top of another with a cavity arranged in between is cost-effective. This is because, by applying a semiconductor wafer, a metal wafer and/or a plastic wafer to an active semiconductor wafer with microelectromechanical structures, it is possible, after complete crosslinking of the polymer layers of the passive wafer and of the active wafer, to separate both wafers jointly into individual microelectromechanical semiconductor components. A congruence between the chips arranged or stacked one on top of another arises practically automatically in this case.

A method for producing a plurality of semiconductor components has the following method steps. The first step involves producing a semiconductor wafer with a multiplicity of semiconductor chip positions arranged in rows and columns. Microelectromechanical structures and wiring structures are arranged onto the semiconductor wafer in semiconductor chip positions on the top side. The order when applying microelectromechanical structures and/or wiring structures may be different, that is to say that it is perfectly possible to apply the microelectromechanical structures first and then the wiring structures, and vice versa.

After the completion of the microelectromechanical structures and the wiring structures, wall structures of a polymer which surround the microelectromechanical structures are applied in the semiconductor chip positions. This is followed by precuring of the polymer with precrosslinking of the chain molecules of the polymer. A covering wafer made from a semiconductor wafer, or a metal wafer, or a plastic wafer or a glass wafer is produced in parallel with the production and patterning of the semiconductor wafer. Said covering wafer is coated with a layer as covering for the walls made from a polymer of identical type to the wall structure. This polymer layer, too, is precured with precrosslinking of the chain molecules of the polymer and may, if necessary, also be patterned.

This prepared covering wafer with the precured polymer layer is then applied to the semiconductor wafer with precured wall structure. Afterward, the polymers lying one on top of another are cured with crosslinking of the chain molecules of the polymers to form cavities over the microelectromechanical structures. Finally, the semiconductor wafer may be separated to form individual semiconductor components with microelectromechanical structures having at least one cavity.

With this method a multiplicity of microelectromechanical components can be produced cost-effectively in a sandwich design. The intensive complete crosslinking of the chain molecules of the polymers, both of the polymer layer and of the polymers of the wall structure, gives rise to a cavity housing over the microelectromechanical structure made from a polymer housing.

In one exemplary implementation of the method, the covering wafer serves as an auxiliary carrier and is removed from the polymer layer prior to the actual separation of the active semiconductor wafer into individual semiconductor components. With this implementation, the top sides of the semiconductor chip positions of the semiconductor wafer are then freely accessible, so that the polymer layer of the covering wafer can be patterned while the cavity structure already exists. Contact areas of the wiring structure that are arranged on the top side can be uncovered during this patterning.

In one example, on the covering wafer, the polymer layer is already patterned before the covering wafer is actually placed onto the active semiconductor wafer, in such a way that the contact areas remain free of polymer material during the placement of the covering wafer. This variant has the advantage that subsequent uncovering of the contact areas is obviated.

Removal of the covering wafer, if it serves as an auxiliary carrier, is provided in both cases. For this purpose, the adhesion forces of the individual layers are coordinated with one another in such a way that a delamination of the cavity housing from the active semiconductor wafer does not occur. A delamination of the polymeric covering from the polymeric walls of the cavity is also prevented by intensive crosslinking of the polymer materials. In addition, a surface coating of the covering wafer may reduce the adhesion to the polymer layer. Furthermore, it is possible to use a transparent plastic wafer or a glass wafer as an auxiliary carrier which enables UV irradiation of the polymer in order to reduce the adhesion thereof to the plastic or glass wafer. In this case, an acrylic material is preferably used as plastic.

A further aspect of the invention provides for not removing the covering wafer, but rather using it as a self-supporting cover for a covering chip. For this purpose, after the application of microelectromechanical structures to the top side of the semiconductor wafer, through contacts through the semiconductor wafer are produced, and the wiring structure is subsequently applied, which electrically connects the through contacts to the microelectromechanical structures. In this exemplary implementation, firstly holes are etched into the semiconductor wafer at the positions of the through contacts, which holes are filled with metal during the subsequent production of the wiring structure.

In this case, the depth of said holes may be smaller than the thickness of the semiconductor wafers if the semiconductor wafer is subsequently thinned and the through contact is thereby uncovered. However, if it is provided that the semiconductor wafer is not thinned, then firstly passage holes are etched, for example, anisotropically into the semiconductor wafer at the locations of the through contacts and said passage holes are subsequently filled with metal, preferably in an electrodeposition method. Depending on the outlay and sequence of the fabrication of the microelectromechanical structures, the completion of the through contacts may be adapted to the production of the microelectromechanical structures. It is also possible to combine the completion of the through contacts with the completion of the wiring structure.

One method for the application of wall structures made from a polymer has the following method steps. The first step involves spraying or spinning a photolithographically patternable polymer layer onto the semiconductor wafer. In one example, said polymer layer is constructed from a benzocyclobutene, and is applied to the top side of the semiconductor wafer with microelectromechanical structure and with completed wiring structure. This is followed by a photolithographic patterning of the polymer layer to form wall structures which leave free and surround the microelectromechanical structures. Afterward, it is possible to carry out a precuring of the polymer layer that has been patterned to form walls with precrosslinking of the chain molecules of the polymer of the wall structure at a precuring temperature. Such precuring temperatures $T_v$ typically lie between $80 \leq T_v \leq 150°$ C. With this method for producing wall structures, a multiplicity of wall structures can be produced in parallel for a multiplicity of microelectromechanical semiconductor devices on a semiconductor wafer.

In order to prepare the covering of the wall structure, a covering wafer, preferably made from a passive semiconductor wafer, is provided with a polymer layer that is not patterned. A polymer layer corresponding to the wall polymer can also be sprayed or spun onto a metal wafer, or a plastic wafer, instead of a passive semiconductor wafer, said polymer layer subsequently being precured with precrosslinking of the chain molecules of the polymer at a precuring temperature U, as already mentioned above.

In one example, during the application of the covering wafer with the precured polymer layer to the active semiconductor wafer with the precured wall structure, a pressure is additionally exerted on the two wafers, thereby supporting the full crosslinking of the chain molecules of the polymer at curing temperature. Such a curing temperature $T_A$ lies between $100°$ C.$\leq T_A \leq 230°$ C. During the curing, too, in one preferred exemplary embodiment of the method, the additional pressure that was used during the application can be maintained during the curing.

Depending on the diameter of the wafers, the latter have a considerable thickness in part in order to remain dimensionally stable and self-supporting during the various high-temperature processes in semiconductor technology. After the application and prior to the separation of the wafers including a covering wafer and an active semiconductor wafer that are stacked one on top of another in sandwich like fashion, either the covering wafer and/or the active wafer and/or both may be thinned by means of a chemomechanical removal, or by means of etching removal or by means of laser removal. As a result, it is possible to provide semiconductor components having a minimal height or minimal thickness. The separation of the wafers lying one on top of another finally produces chips which lie one on top of another, are congruent and have identical areal extents.

It is furthermore provided that, prior to the separation of the semiconductor wafer with covering wafer to form individual semiconductor components, on the rear side of the active semiconductor wafer, external contact areas and/or external contacts are arranged in the region of through contacts. With this, the bonding connections customary heretofore can be dispensed with, with the result that a further spatial miniaturization of the semiconductor components is possible here as well.

In order to position the underside of the semiconductor component with external contacts and/or external contact areas independently of the positioning of the through contacts through the active semiconductor chip, it is provided that on the rear side of the semiconductor chip there is arranged an additional wiring structure whose conductor tracks and which electrically connects positions of the through contacts to external contact areas and/or external contacts. As a result it is possible to distribute on the underside of the microelectromechanical semiconductor component external contact areas and/or external contacts for surface mounting independently of the positions of the plated-through holes.

A microelectromechanical semiconductor component according to one embodiment of the invention and also the method for producing it have the following features:

1. the provision of a cost-effective and compact cavity housing which, for example for BAW filters, has a clear height in the micron and/or submicron range. The cost-effective production is based on the fact that all processes take place at the wafer level and cost-intensive individual processes such as the production of individual covers, the equipping of individual semiconductor components with covers, the so-called die bonding or the so-called wire bonding are avoided, wherein in the case of die bonding a semiconductor chip is fixed on a substrate and in the case of wire bonding the top side of the semiconductor chip is connected to the substrate by means of bonding wires. Finally, the so-called molding process in which packaging into a plastic housing composition is effected can also be obviated.

2. The possibility of thinning the semiconductor devices at the wafer level with high reliability because the active microelectromechanical structure is not uncovered as in a standard wafer level package, but rather is protected by a cover.

3. Straightforward integrability of different MEMs (Microelectromechanical semiconductor components) by means of the housing technology according to the invention.

4. Reduction of the space requirement by use of the through contacts in silicon in accordance with the first embodiment of the invention, so that on the chip side only little space is necessary for the polymer walls, which, moreover, are still photo patternable. This space requirement is small in comparison with the customary area requirement during wire bonding. In addition, the area requirement for contact pads of the wire bonding is completely obviated.

FIG. 1 illustrates a schematic cross section through a microelectromechanical semiconductor component 1 with cavity structure 2 in a cavity housing 15. In this embodiment of the invention, the microelectromechanical semiconductor component 1 has two cavities 10 and 11 arranged between an active semiconductor chip 3 in the lower region of the semiconductor component and a covering chip 23. The covering chip 23 serves as cover 12 of the cavities 10 and 11, and is arranged in the upper region of the semiconductor component 1. In this case, the top side 24 of the covering chip simultaneously forms the top side of the semiconductor component 1, and the rear side 18 of the active semiconductor chip 3 simultaneously forms the underside of the microelectromechanical semiconductor component 1.

Microelectromechanical structures 4 are arranged on the top side 6 of the active semiconductor chip 3 in the bottom region of the cavities 10 and 11. Said microelectromechanical structures 4 are in one example BAW filters and/or vibrating membranes and/or vibrating spring-elastic reeds. The microelectromechanical structures 4 are electrically connected to external contact areas 17 on the rear side 18 of the active semiconductor chip 3 by means of a wiring structure 5 and through contacts 16, so that signals can be conducted via the external contact areas 17 to the microelectromechanical structures 4 and/or from the microelectromechanical structures 4.

The cavity structure 2 with the two cavities 10 and 11 is formed from two polymer layers. The lower polymer layer 13 forms a wall structure 27 with the walls 7, 8 and 9 illustrated here, which were produced photolithographically from a closed polymer layer 13. A non-patterned polymer layer 14 is arranged on the underside 25 of the covering chip 23 and includes a polymer of identical type to the walls 7, 8 and 9. The chain molecules of said polymer layers 13 and 14 are crosslinked together with one another, so that the cavity structure 2 has quasi-hermetically sealed cavities 10 and 11 over the microelectromechanical structures 4.

The covering chip 23 may have, as cover 12, a passive semiconductor chip, a metal chip and/or a plastic chip. This depends entirely on the application. A plastic chip is chosen when the microelectromechanical structure 4 is intended to react with an external electromagnetic field. A metal chip is used when the microelectromechanical structure 4 is intended to be shielded from electromagnetic fields from the environment. If the intention is to provide a coupling between the cavities 10 and 11 and the environment, then the covering chip 23 may also have corresponding openings which are introduced both into the covering chip 23 and into the polymer layer 15.

On account of the self-supporting and dimensionally stable covering chip 23, it is possible to realize cavities 10 and 11 having a height h in the submicron range. For BAW filters, such a minimal height h suffices to mechanically decouple the piezoelectric elements, from which such BAW filters may be constructed, from the surrounding plastic of the cavity structure. Moreover, it is possible to use thinned semiconductor wafers both for the active semiconductor chip 3 and for the covering chip 23, with the result that the total height H of the microelectromechanical semiconductor device 1 can be minimized to a few tens of micrometers.

FIGS. 2 to 10 illustrate schematic cross sections through components during the production of the microelectromechanical semiconductor component 1, in accordance with FIG. 1. Components having the same functions as in FIG. 1 are identified by the same reference symbols in FIGS. 2 to 9 and are not discussed separately.

Figure 2:
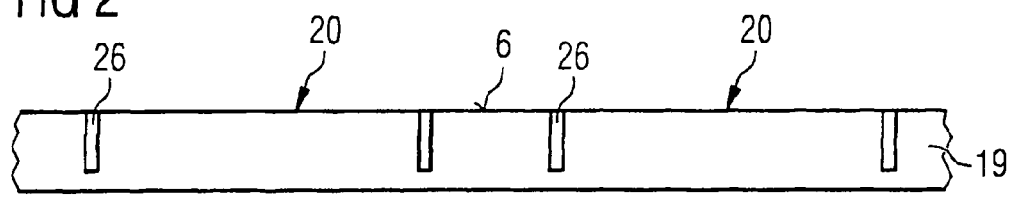
FIGS. 2 to 10 illustrate schematic cross sections through components during the production of the microelectromechanical semiconductor component in accordance with FIG. 1.

FIG. 2 illustrates a schematic cross section through an active semiconductor wafer 19 with semiconductor chip positions 20. Blind holes 26 are introduced into the top side 6 of the semiconductor wafer 19, and are filled with electrically conductive material in a later step to form through contacts through the semiconductor wafer 19.

Figure 3:
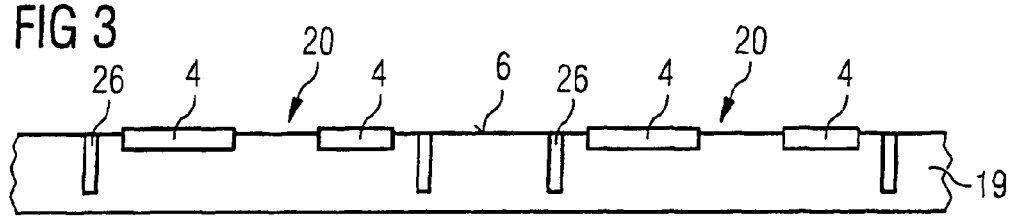

FIG. 3 illustrates a schematic cross section through the semiconductor wafer 19, in accordance with FIG. 2, with microelectromechanical structures 4 introduced in the semiconductor chip positions 20. In this embodiment of the invention, two microelectromechanical structures 4 are in each case provided per semiconductor chip position.

Figure 4:
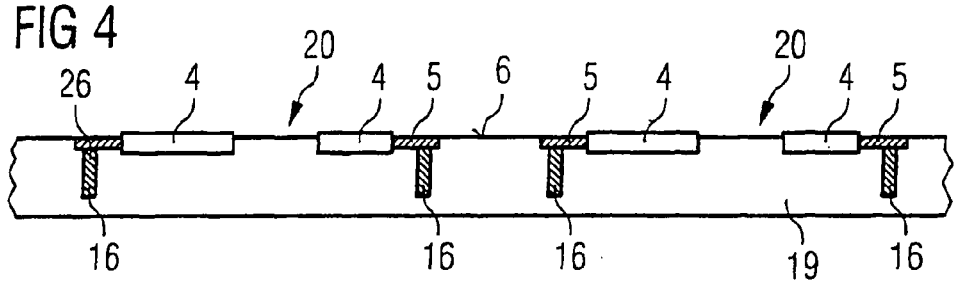

FIG. 4 illustrates a schematic cross section through the semiconductor wafer 19, in accordance with FIG. 3, after the application of a wiring structure 5. At the same time as the application of the wiring structure 5, the blind holes 26 are also filled with conductive material, such as a metal, in preparation for through contacts. The wiring structure 5 connects the through contacts 16 to the microelectromechanical structures 4 in the semiconductor chip positions 20.

Figure 5:
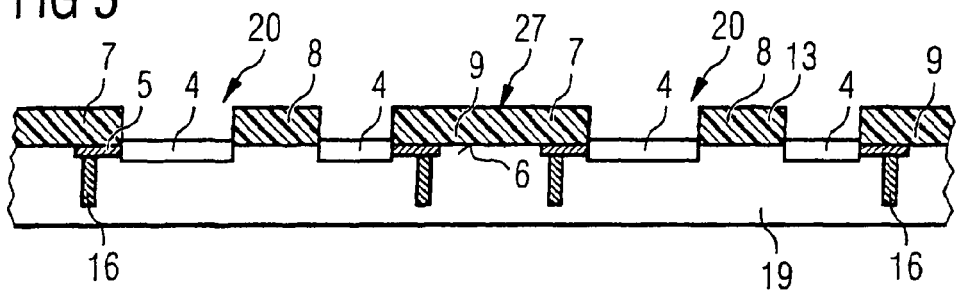

FIG. 5 illustrates a schematic cross section through the semiconductor wafer 19, in accordance with FIG. 4, after the application of a wall structure 27 comprising a photolithographically patternable polymer 13, preferably a benzocyclobutene (BCB). The walls 7, 8 and 9 remain as a result of the photolithographic patterning, said walls surrounding the microelectromechanical structures 4 on the top side 6 of the semiconductor wafer 19.

Figure 6:
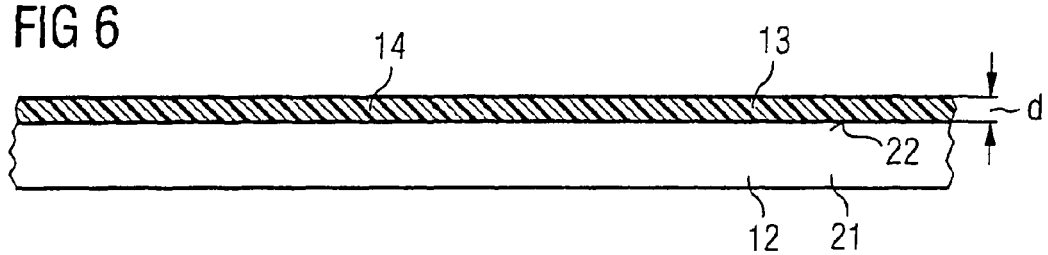

FIG. 6 illustrates a schematic cross section through a covering wafer 21. Said covering wafer 21 serves as a cover 12 for the active semiconductor wafer 19 illustrated in FIG. 5. For this purpose, a polymer layer 14 is deposited on the top side 22 of the covering wafer 21, which may include semiconductor material, metal or plastic, said polymer layer comprising a polymer 13 which crosslinks with the polymer of the wall structure 27 in FIG. 5, but said polymer layer 14 is not patterned. Depending on the application, said non-patterned polymer layer may have a thickness d lying within the range of $0.3\ \mu m \leq d \leq 80\ \mu m$.

Figure 7:
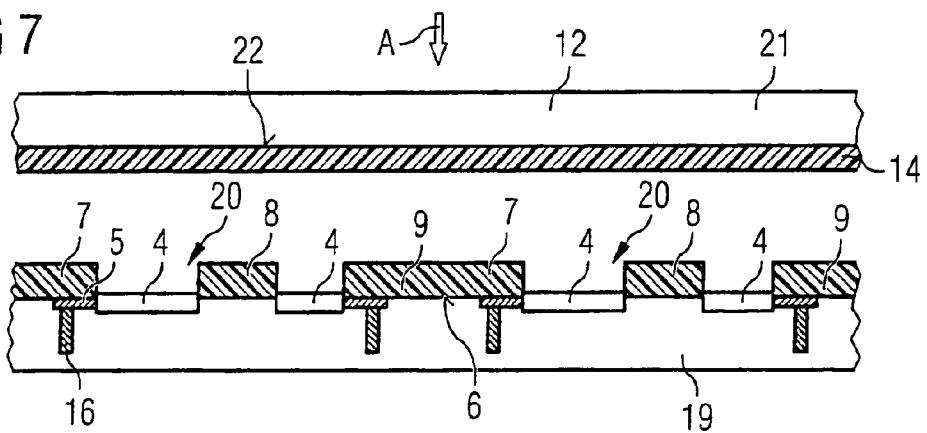

FIG. 7 illustrates a schematic cross section through the semiconductor wafer 19, in accordance with FIG. 5, and the covering wafer 21 arranged above it, which covering wafer is intended to be placed by its merely precured and hence pre-crosslinked polymer layer 14 onto the polymeric wall structure 27 of the active semiconductor wafer 19 in arrow direction A.

Figure 8:
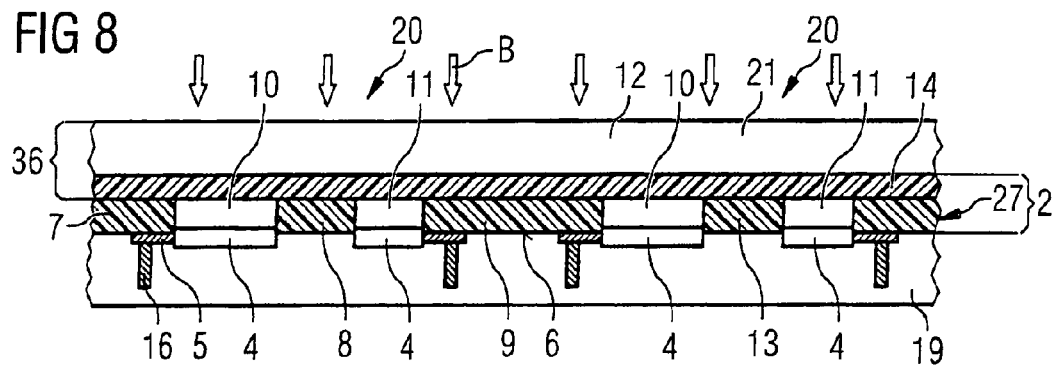
Figure 9:
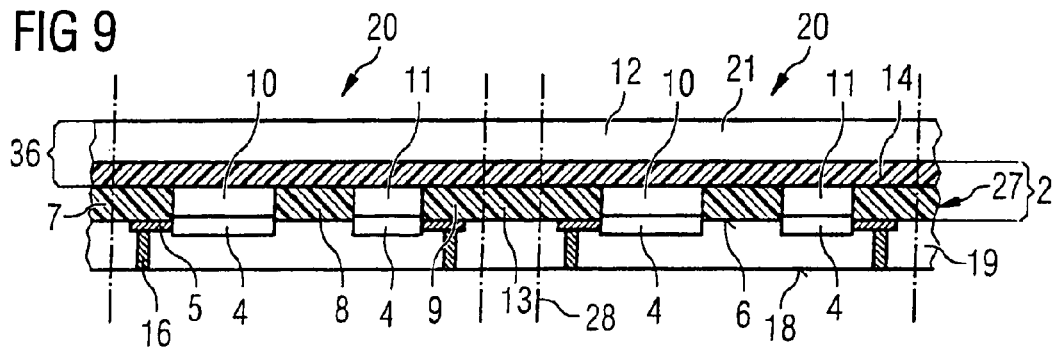

FIG. 8 illustrates a schematic cross section through the semiconductor wafer 19, in accordance with FIG. 7, after the placement of the covering wafer 21, the arrow direction B being intended to indicate a pressure direction in which the covering wafer 21 is pressed by its polymer layer 14 onto the wall structure 27 of the active semiconductor wafer 19 at elevated curing temperature. Said curing temperature $T_A$ typically lies between $80°\ C. \leq T_A \leq 230°\ C.$ FIG. 9 illustrates a schematic cross section through the semiconductor stack after the curing of the polymer 13 and 14 arranged between the two wafers 19 and 21 and after the two wafers 19 and 21 have been thinned by grinding, with the result that the dummy contacts as illustrated in FIG. 4 now form through contacts 16 through the active semiconductor wafer 19. In a last step, external contact areas 17 can then be applied on said through contacts 16 on the thinned rear side 18 of the active semiconductor chip 19. If the external contact areas 17 are to be fitted at a distance from the positions of the through contacts 16, it is possible to arrange a further wiring structure on the rear side 18 of the thinned semiconductor wafer 19. Finally, the wafer stack illustrated in FIG. 9 is separated into individual semiconductor components along the dash-dotted lines 28.

Figure 10:
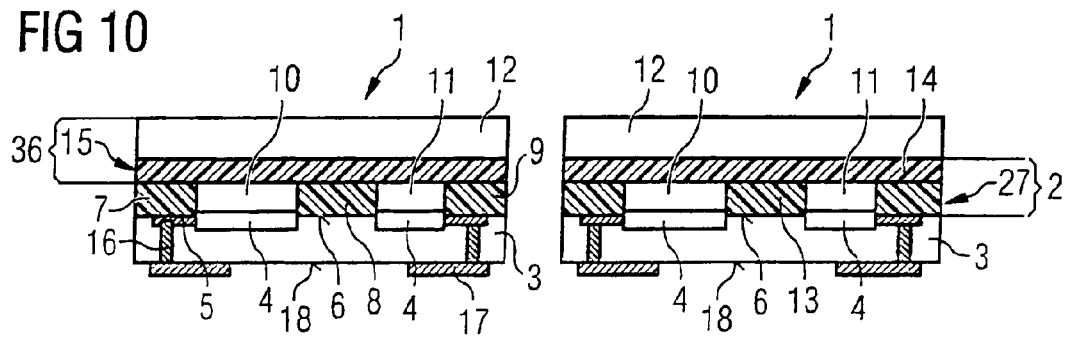

FIG. 10 illustrates a schematic cross section through two microelectromechanical semiconductor components 1 after the separation of the semiconductor wafer stack illustrated in FIG. 9. Components in FIG. 10 having the same functions as in FIG. 1 are identified by the same reference symbols and are not discussed separately.

Figure 11:
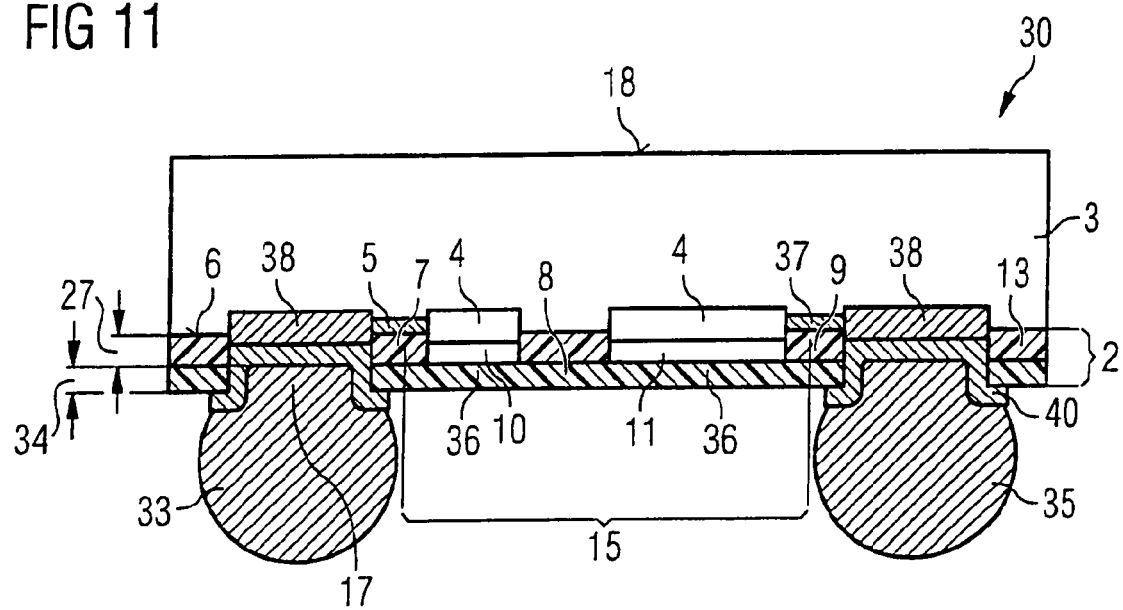
FIG. 11 illustrates a schematic cross section through a semiconductor component of a second embodiment of the invention.

FIG. 11 illustrates a schematic cross section through a semiconductor component 30 of a second embodiment of the invention. Said semiconductor component 30 has a semiconductor chip 3 with a rear side 18 and a top side 6. The top side 6 of the semiconductor chip 3 simultaneously forms the underside of the semiconductor component 30. Microelectromechanical structures 4 surrounded by a wall structure 27 made from the walls 7, 8 and 9 are arranged on the top side 6 of the semiconductor chip 3. The wall structure 27 includes a patterned polymer layer 13 and is covered by a second patterned polymer layer 34.

In this case, the patterned polymer layer 34 is continuous and sealed over the microelectromechanical structures 4, while it leaves free contact areas 38 of the semiconductor chip 3. Arranged on the contact areas 38 is a UBM metallization 40, which provides for the compensation of thermal stresses between the semiconductor chip 3 and a superordinate circuit board (not illustrated), so that the semiconductor component 30 is surface-mountable by its external contacts 35. An external contact area 17, on which solder balls 33 are fixed as external contacts 35, is arranged on the UBM layer 40. In this case, the patterned polymer layer 34 serves not only as covering 36 of the cavities 10 and 11 but also as a solder resist layer. The semiconductor chip 3 has on its top side 6, alongside the microelectromechanical structures 4 and the contact areas 38, a wiring structure 5 with conductor tracks 37, the conductor tracks 37 electrically connecting the contact areas 38 to the microelectromechanical structures 4.

Instead of the semiconductor chip 3, it is also possible to use a semiconductor chip embedded into a plastic housing composition, the top side 6 of the semiconductor chip forming a coplanar area with the surrounding plastic housing composition, on which coplanar area it is possible to arrange the wiring structure 5 with the contact pads 38. As a result, it is possible, on the one hand, to save semiconductor material and, on the other hand, to provide larger and/or a larger number of solder balls 33 or else larger contact areas 38. This possibility is not discussed, however, in the descriptions below regarding the production of such a semiconductor component 30.

The difference between the semiconductor component 1 of the first embodiment of the invention, in accordance with FIG. 1, and the semiconductor component 30 of the second embodiment of the invention, in accordance with FIG. 11, consists, on the one hand, in the fact that the covering of the cavities 36 is not supported by a self-supporting cover 12 as in FIG. 1 and, on the other hand, in the fact that through contacts 16 such as are also provided in the first embodiment of the invention, in accordance with FIG. 1, are dispensed with in this embodiment of the invention. Finally, the rear side 18 of the semiconductor chip 3 forms the underside of the semiconductor component in FIG. 1, while in the second embodiment, in accordance with FIG. 11, the underside of the semiconductor component 30 is formed by the active top side of the semiconductor chip with cavity housing.

FIGS. 12 to 16 illustrate schematic cross sections through components during the production of the semiconductor component 30 of the second embodiment of the invention. For this purpose, FIG. 12 illustrates a schematic cross section through an active semiconductor wafer 32 with semiconductor chip positions 20 and a covering wafer 21 as auxiliary carrier 29 with a patterned polymer layer 34. The arrangement in FIG. 12 corresponds to the arrangement in FIG. 7 during the production of a semiconductor component of the first embodiment of the invention, but with the difference that the covering wafer 21 in FIG. 12 serves as an auxiliary carrier 29 and the polymer layer 14 from FIG. 7 is now a patterned polymer layer 34 having the coverings 36 in the semiconductor device positions 20 of the semiconductor chip 32.

Said coverings 36 are aligned in such a way that they attain congruence with the walls 7, 8 and 9 in the semiconductor device positions 20 of the semiconductor wafer 32, while the openings 41 are provided opposite the contact areas 38 and the openings 42 are introduced into the patterned polymer layer 34 in strip-type fashion at the sawing positions in which sawing tracks will later run. This ensures that the saw blades are not fouled or contaminated by polymer material.

FIG. 13 illustrates a schematic cross section through the semiconductor wafer 32, in accordance with FIG. 12, after the placement of the auxiliary carrier 29 in arrow direction A. In this case, the covering wafer 21 and the semiconductor wafer 32 are brought to a curing temperature of the polymer, the patterned polymer layers 34 and 13 crosslinking with one another and forming cavity housings 15 in the regions of the microelectromechanical structures 4. At the same time it is also possible to exert a pressure in order to intensify this linking.

In this case, the top side 22 of the covering wafer 21 is prepared in such a way that the covering wafer 21 can be used as a removable auxiliary carrier 29. For this purpose, the adhesion between the auxiliary carrier 29 and the patterned polymer layer 34 is reduced in such a way that no delamination of the patterned polymer layer 34 from the patterned polymer layer 13 of the semiconductor wafer 32 occurs, nor does any delamination take place between semiconductor wafer 32 and patterned polymer layer 13.

Moreover, it is possible to thin the semiconductor wafer 32 as far as the dash-dotted line 39, while the auxiliary carrier 29 still protects the semiconductor device positions 20 from damage. In order to reduce the adhesion of an auxiliary carrier 29 to the patterned polymer layer 34, the auxiliary carrier may include a transparent plastic such as an acrylic material and/or a glass, in which case, in order to reduce the adhesion, it is possible to carry out an additional curing of the polymer by means of UV irradiation, as is illustrated in FIG. 21.

Figure 14:
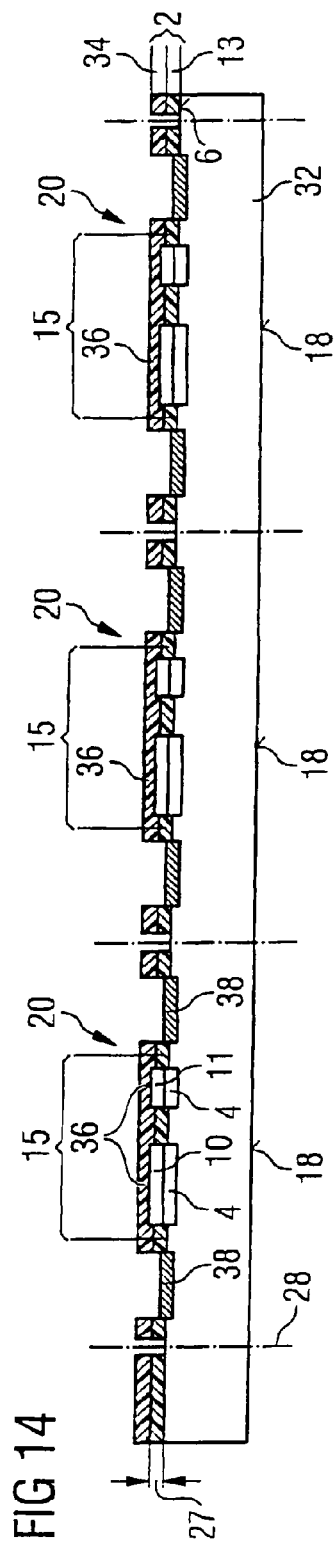

FIG. 14 illustrates a schematic cross section through the semiconductor wafer 32 in accordance with FIG. 13 after the removal of the auxiliary carrier 29. On account of the patterning of the polymer layer 34, the contact areas 38 and also the sawing tracks at the dash-dotted lines 28 are now freely accessible, while the microelectromechanical structures 4 are protected by the cavity housing 15 with the cavities 10 and 11.

Figure 15:
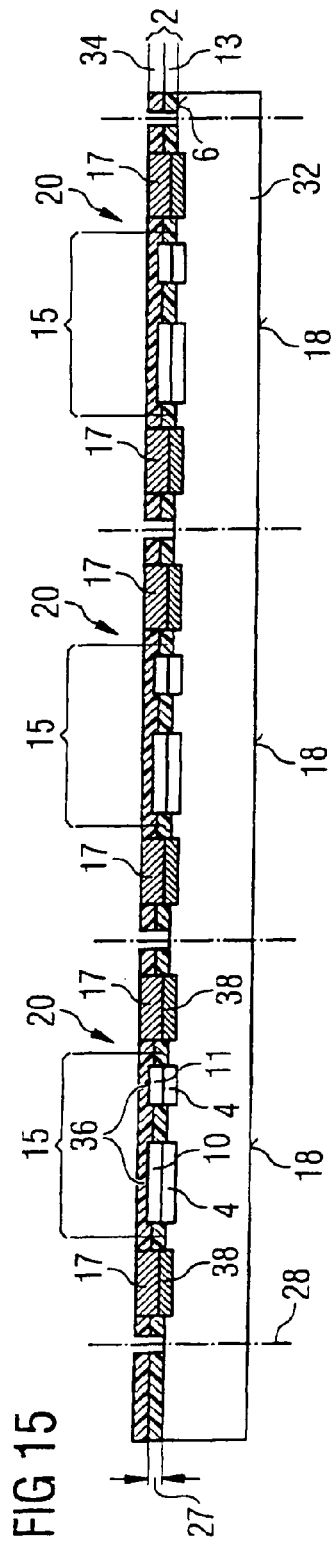

FIG. 15 illustrates a schematic cross section through the semiconductor wafer 32 in accordance with FIG. 14 after the application of external contact areas 17 for surface mounting. Instead of the external contact areas 17, it is also possible firstly to carry out a UBM metallization on the contact areas 38, and afterward it is possible to apply external contact areas 17 in the form of a solder deposit or by electrodeposition.

Figure 16:
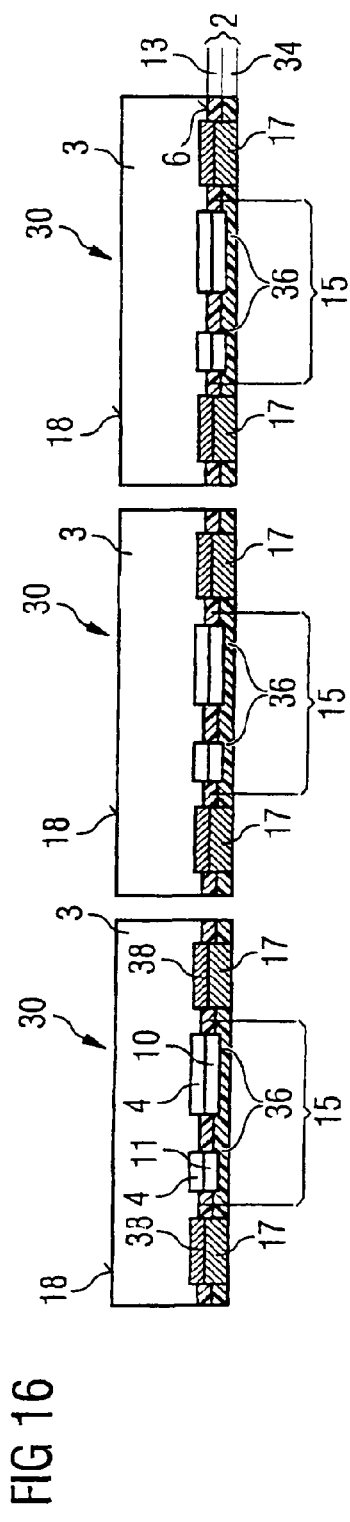

FIG. 16 illustrates schematic cross sections through semiconductor components 30 of the second embodiment of the invention. These semiconductor components 30 differ from the semiconductor component illustrated in FIG. 11 merely by the fact that external contacts are not yet arranged on the external contact areas 17. However, these can also be applied individually to each of the semiconductor components.

Figure 17:
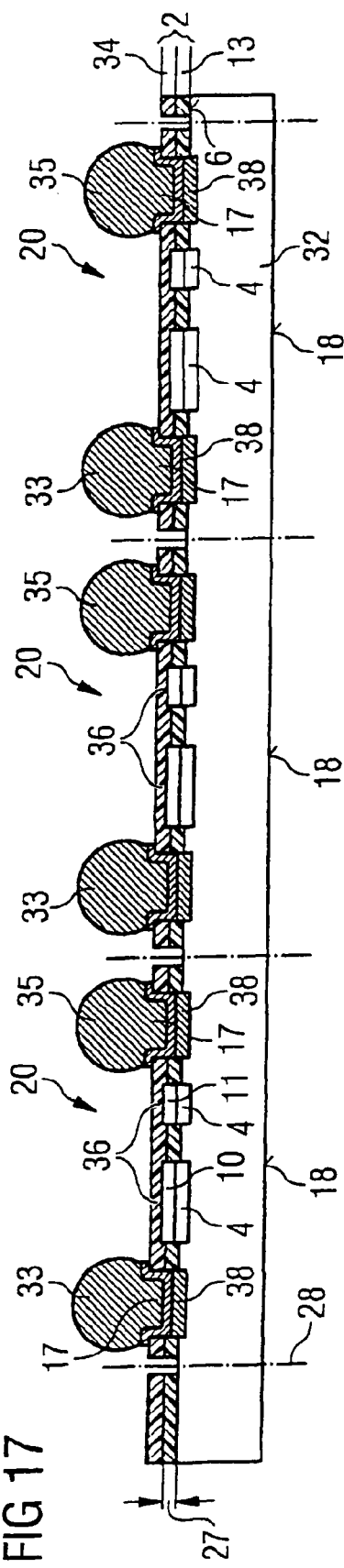
FIG. 17 illustrates a schematic cross section through the semiconductor wafer, in accordance with FIG. 15, after the application of solder balls as external contacts.

In one embodiment of the invention as illustrated in FIG. 17, however, the external contacts 35 are additionally applied to the external contact areas 17 before the semiconductor wafer 32 is separated into individual semiconductor components 30. FIG. 17 correspondingly illustrates a schematic cross section through the semiconductor wafer 32, in accordance with FIG. 15, after the application of solder balls 33 as external contacts 35.

Figure 18:
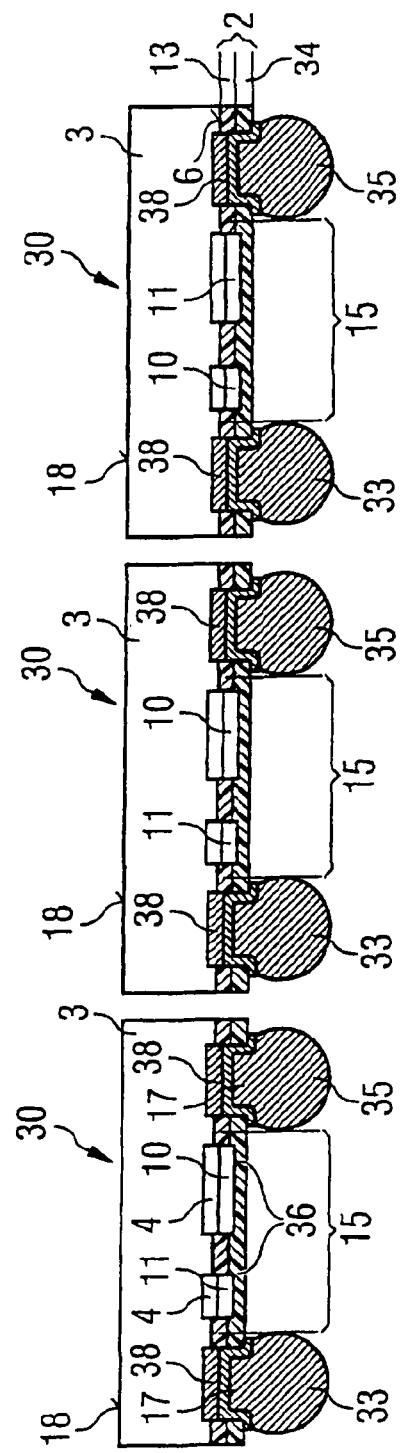
FIG. 18 illustrates a schematic cross section through the semiconductor component of the second embodiment of the invention in accordance with FIG. 11.

FIG. 18 illustrates a schematic cross section through semiconductor components 30 of the second embodiment of the invention in accordance with FIG. 11. Components having the same functions as in FIG. 11 are identified by the same reference symbols and are not discussed separately in FIG. 18. In principle, the components 30 of FIG. 18 correspond to the component in FIG. 11.

Figure 19:
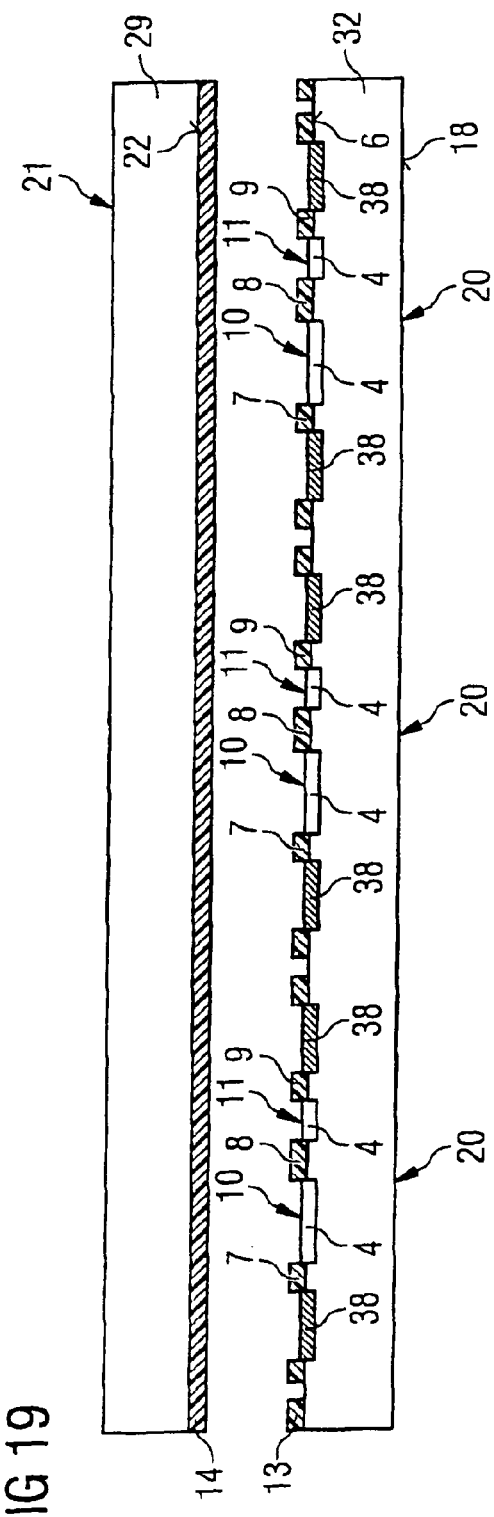
Figure 20:
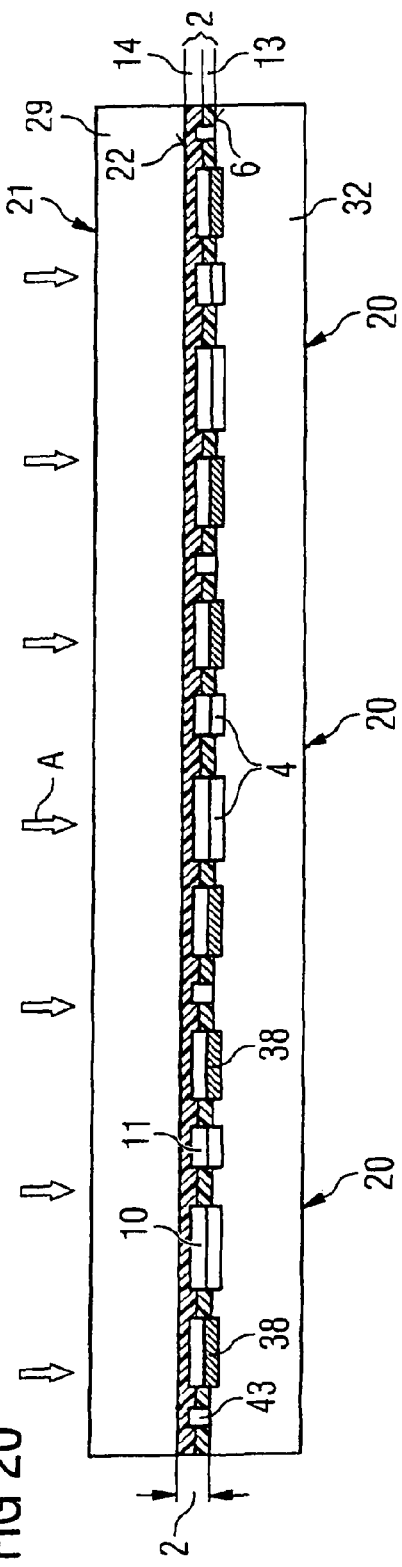

FIGS. 19 to 21 illustrate schematic cross sections through components during the production of the semiconductor component 30, in accordance with FIG. 11, by means of a further method variant. Components having the same functions as in FIGS. 11 to 18 are identified by the same reference symbols and are not discussed separately.

FIG. 19 illustrates a schematic cross section through an active semiconductor wafer 32 with semiconductor chip positions 20 and an auxiliary carrier 29 with a non-patterned polymer layer 14. This arrangement, in accordance with FIG. 19, corresponds to the arrangement in FIG. 7 in so far as the covering wafer 21 is concerned, which, here as well, includes a closed, non-patterned polymer layer 14. However, the semiconductor wafer 32 also has at its active top side 6, in addition to the microelectromechanical structures 4 illustrated in the first exemplary embodiment, freely accessible openings in the patterned polymer layer 13 which permit access to contact areas 38.

FIG. 20 illustrates a schematic cross section through the semiconductor wafer 32, in accordance with FIG. 19, after the placement of the auxiliary carrier 29 in arrow direction A. In this case, a crosslinking of the patterned polymer layer 14 with the patterned polymer layer 13 is simultaneously carried out via temperature under pressure. However, after the removal of the auxiliary carrier 29, the contact pads 38 and the sawing tracks 43 are also covered by the closed polymer layer 14.

FIG. 21 illustrates a schematic cross section through the semiconductor wafer 32, in accordance with FIG. 20, after the removal of the auxiliary carrier 29 and after the arrangement of an exposure mask 31 over the top side 6 of the semiconductor wafer 32. The closed polymer layer 14 can then be patterned with the aid of such an exposure mask 31. A prerequisite for this, however, is that the heat treatment step illustrated in FIG. 20 does not lead to a complete crosslinking of the polymer layer 14, but rather permits a patterning by means of photolithographic measures. In this case, only the regions which serve for the covering 36 of the microelectromechanical structures are precrosslinked further by exposure in arrow direction B, so that the remaining areas that have not been crosslinked further can be correspondingly dissolved out by solvent. Further patterning possibilities for the polymer layer 14 consist in using a laser ablation, a photo patterned etching resist layer or an etching resist layer applied by a printing method.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a plurality of semiconductor components comprising:
   producing a semiconductor wafer with a plurality of semiconductor chip positions arranged in rows and columns;
   applying microelectromechanical structures and wiring structures on at least an active top side of the semiconductor wafer in the semiconductor chip positions;
   applying of wall structures of a polymer on the active top side to surround the microelectromechanical structures in the semiconductor chip positions;
   precuring the polymer with precrosslinking of the chain molecules of the polymer;
   producing a covering wafer made from a semiconductor wafer or a metal wafer or a plastic wafer or a glass wafer;
   coating the covering wafer with a layer of a polymer of identical type as covering for the walls;
   precuring the polymer with precrosslinking of the chain molecules of the polymer;
   applying of the covering wafer with the precured polymer layer to the semiconductor wafer with precured wall structure;
   curing the polymers lying one on top of another with crosslinking of the chain molecules of the polymers to form cavities over the microelectromechanical structures, wherein the wiring structures for each of the microelectromechanical structures are applied with a portion external to the cavity which is covered by the polymer of the wall structures and a portion extending into the cavity for electrical connection to the microelectromechanical structure, with any through-connections through the wafer being made to the portion of the wiring structures external to the cavities; and
   separating the semiconductor wafer to form individual semiconductor components.

2. The method of claim 1, wherein the covering wafer is used as an auxiliary carrier, and, prior to the separation of the semiconductor wafer, is removed from the latter.

3. The method of claim 1, wherein the covering wafer is used as a self-supporting cover and is separated with the semiconductor wafer to form individual semiconductor components with covering chip.

4. The method of claim 1, wherein the following method steps are performed for the application of wall structures of a polymer or for the patterning of the polymer layer on the covering wafer:
   spraying or spinning of a photolithographically patternable polymer layer, preferably of benzocyclobutene, onto the top side of the wafer,
   photolithographic patterning of the polymer layer to form wall structures and/or covering structures which leave free and surround or cover the microelectromechanical structures; and
   precuring of the polymer layer that has been patterned to form walls and/or to form coverings with precrosslinking of the chain molecules of the wall structure and/or the covering structure of a polymer at a precuring temperature.

5. The method of claim 1, wherein for the coating of the covering wafer, a polymer layer is sprayed or spun onto a passive semiconductor wafer, a metal wafer or a plastic wafer or a glass wafer and is subsequently precured with precrosslinking of the chain molecules of the polymer at a precuring temperature.

6. The method of claim 1, wherein during the application of the covering wafer with the precured polymer layer to the semiconductor wafer with a precured wall structure, an additional pressure is exerted on the two wafers.

7. The method of claim 1, wherein during the curing of the polymers lying one on top of another with crosslinking of the chain molecules of the polymers, an additional pressure is exerted on the wafers.

8. The method of claim 1, wherein prior to the separation of the semiconductor wafer with covering wafer, at least one of the wafers is thinned by means of chemomechanical removal or by means of etching removal or by means of laser removal.

9. The method of claim 1, wherein during the application of wiring structures on the top side of the active semiconductor wafer, external contact areas and conductor tracks are provided which are electrically connected to the microelectromechanical structures and are kept free of a polymer coating and/or polymer covering.

10. The method of claim 9, wherein a closed incompletely crosslinked polymer layer is applied to the wall structure through the covering wafer as auxiliary carrier and, after the removal of the auxiliary carrier, the polymer layer is patterned in such a way that external contact areas of the wiring structure are uncovered.

11. The method of claim 1, wherein after or prior to the application of microelectromechanical structures to the top side of the semiconductor wafer, through contacts through the semiconductor wafer are produced, and the wiring structure is subsequently applied, which electrically connects the through contacts to the microelectromechanical structures.

12. The method of claim 11, wherein prior to the separation of the semiconductor wafer with covering wafer to form individual semiconductor components with covering chip, on the rear side of the active semiconductor wafer, external contact areas and/or external contacts are arranged in the region of the through contacts.

13. The method of claim 11, wherein prior to the separation of the semiconductor wafer with covering wafer to form individual semiconductor components, a wiring structure with conductor tracks and external contact areas is applied on the rear side of the active semiconductor wafer, the conductor tracks electrically connecting the external contact areas to through contacts through the semiconductor wafer.

14. The method of claim 9, wherein prior to the separation of the semiconductor wafer, solder balls as external contacts are applied to external contact areas.

15. The method of claim 9, wherein prior to the separation of the semiconductor wafer, solder deposits as external contacts are applied to external contact areas.

16. The method of claim 1, wherein the wiring structures on the top side of the semiconductor wafer include contacts areas, and wherein the coating wafer includes through holes aligned with the contact areas.

17. The method of claim 16, including depositing a metallization on each contact area, the metallization extending through the through hole and arranged bout at least a portion of the perimeter of the through hole on a surface of the coating wafer.

18. The method of claim 17, including arranging solder deposits on each metallization which enables the semiconductor to be mounted on a higher level substrate with the top side of the microelectromechanical structures facing down.

* * * * *